United States Patent [19]

Schutyser

[11] Patent Number: 5,153,024
[45] Date of Patent: Oct. 6, 1992

[54] PROCESS FOR MANUFACTURING A PRINTED CIRCUIT BOARD BY COATING A POLYMERIC SUBSTRATE WITH A MODIFIED POLYAMINE LAYER AND FURTHER CONTACTING THE COATED SUBSTRATE WITH NOBLE METAL IONS

[75] Inventor: Jan A. J. Schutyser, Dieren, Netherlands

[73] Assignee: Akzo nv, Arnhem, Netherlands

[21] Appl. No.: 616,453

[22] Filed: Nov. 20, 1990

[30] Foreign Application Priority Data

Nov. 22, 1989 [NL] Netherlands .................... 8902886

[51] Int. Cl.⁵ .............................................. B05D 5/12
[52] U.S. Cl. ....................................... 427/97; 427/98; 427/305; 427/306; 427/443.1; 427/316; 427/322; 427/384
[58] Field of Search .............. 427/98, 305, 316, 443.1, 427/322, 385.5, 97, 306, 322, 384

[56] References Cited

U.S. PATENT DOCUMENTS

| | | | |
|---|---|---|---|
| 3,677,921 | 7/1972 | Stivers | 204/159.19 |
| 3,766,299 | 10/1973 | Dornte | 260/874 |
| 4,335,164 | 7/1982 | Dillard et al. | 427/305 |
| 4,701,351 | 10/1987 | Jackson | 427/305 |
| 4,734,299 | 3/1988 | Motuzaki et al. | 427/305 |
| 4,775,449 | 10/1988 | Dumas et al. | 427/98 |
| 4,873,136 | 10/1989 | Foust et al. | 427/98 |
| 4,910,045 | 3/1990 | Giesecke et al. | 427/98 |
| 5,084,299 | 2/1992 | Hirsch et al. | 427/98 |

FOREIGN PATENT DOCUMENTS 0250867 7/1988 European Pat. Off. .
59-043065 7/1984 Japan .

Primary Examiner—Michael Lusignan
Assistant Examiner—Benjamin L. Utech
Attorney, Agent, or Firm—Louis A. Morris

[57] ABSTRACT

A process for the manufacture of a multilayer printed circuit board including the step of depositing a noble metal onto an electrically non-conducting substrate. The substrate is first coated with a layer of polyamine polymer modified by being contacted with a compound containing at least two functional groups reactive to amino groups. The coated substrate is then contacted with noble metal ions.

9 Claims, No Drawings

PROCESS FOR MANUFACTURING A PRINTED CIRCUIT BOARD BY COATING A POLYMERIC SUBSTRATE WITH A MODIFIED POLYAMINE LAYER AND FURTHER CONTACTING THE COATED SUBSTRATE WITH NOBLE METAL IONS

BACKGROUND OF THE INVENTION

1. Field of the Invention

The invention relates to a laminate comprising a substrate that is wholly or partially non-electrical conducting and at least one layer of a polyamine polymer.

2. Description of the Prior Art

A laminate such as the above is known from U.S. Pat. No. 4,701,351 and serves as a substrate for printed circuits. To this end the laminate is provided with a metal, often copper or nickel. Such metallization can be carried out in an electroless metallization bath, in which a reaction takes place that is catalyzed by noble metal. The laminate known from U.S. Pat. No. 4,701,351 comprises a layer of polyamine polymer which serves to provide the surface area to be metallized with sufficient catalysts through complexing with noble metal ions.

There are several drawbacks to the laminate according to U.S. Pat. No. 4,701,351. Firstly, it can be seen that in some types of substrates metallization across the surface area has been uneven. A possible explanation for this is formed by slight dissolution of the polyamine polymer in the metallization bath. Secondly, this dissolution may be attended with the drawback of noble metal ions being released in the metallization bath. Such baths as a rule contain constituents like formaldehyde, which are capable of reducing noble metal ions to metallic noble metal. The presence of noble metal in a metallization bath will have a negative effect on the bath: the noble metal will start to act as a metallization seed of free noble metal, thus causing metal clumps to be formed.

From U.S. Pat. No. 4,701,351 a process is also known for the deposition of a noble metal onto an electrical non-conducting substrate or onto an electrical non-conducting section of a substrate, the noble metal being tightly bound to the substrate, which process comprises coating the substrate with a layer of polyamine polymer and contacting the coated substrate with noble metal ions.

The drawback to this process is that it is not possible to affect the polyamine polymer's complexing sites. This is of importance because there are various types of metallization baths requiring the utilization of different amounts of noble metal catalyst on the substrate. Thus, the use of a metallization bath requires the presence of just the right amount of noble metal catalyst properly distributed on the substrate. In particular, metallization at sites of too much noble metal concentration will be attended with blistering.

The above-mentioned drawbacks are obviated with the use of the laminate and process according to the invention.

SUMMARY OF THE INVENTION

The invention consists in that in a laminate of the above-mentioned known type at least the layer of polyamine polymer adjacent to the substrate is a crosslinked polymer.

Further, the invention relates to a process for the manufacture of a laminate of the above-described type. Because of the role played by the polyamine polymer—complexing with a catalyst of noble metal—such a process also serves to initiate a process for the electroless metallization of a substrate.

The process according to the invention envisages obviating aforementioned drawback of U.S. Pat. No. 4,701,351. To this end in the process according to the invention the polyamine polymer is modified by being contacted with a compound containing at least 2 functional groups reactive to amino groups prior to the contacting of the coated substrate with the noble metal ions.

DETAILED DESCRIPTION OF THE INVENTION

The laminate of the present invention is found to have the advantage, after metallization, of a clearly improved adhesion of the metal to the substrate (expressed in peel strength) as compared with what is attained with the known laminates. The metal peel strength is an important parameter, notably as regards the current tendency to further miniaturize printed circuits.

Suitable substrates for printed circuits are known to the skilled man. They include polyimides and epoxy resins, but other plastics substrates, reinforced or not, are also suitable for use.

The term "polyamine polymer" is used to indicate amino groups-containing polymers. These may be polyimines which have a polyamine main chain but also polymers which have a hydrocarbon main chain and amino side groups. As a rule, it is possible for suitable polyamine polymers to comprise primary, secondary, and tertiary amino groups in every conceivable combination. If only tertiary amino groups are present, then the polymer should contain other groups that can be subjected to a crosslinking reaction. Examples of such polymers include copolymers of tertiary amine-containing (meth)acrylates, and/or vinylpyridine, and/or (meth)acrylamides having vinyl monomers that may contain other functional groups or not. Alternatively, they may be proteins such as albumen. Diethyl aminoethyl derivatives of cellulose are another example of suitable polyamine polymers.

It is of importance that the polyamine polymer be processable prior to being crosslinked: it has to be possible to apply a thin layer of it to a substrate. Such application can be carried out using known techniques like spray-coating and dip-coating.

The preferred polyamine is polyethylene imine (PEI), since it displays the highest degree of adhesion (physical adsorption) to the largest number of plastics substrates.

The invention also relates to a printed circuit board comprising a layer of metal in the form of a printed circuit and a substrate composed of a laminate of the novel type described above. The advantage to such a printed circuit board is the high metal peel strength referred to hereinbefore. A further advantage to the printed circuit boards prepared from subject laminates is the virtual absence of electromigration. Particularly in miniaturized circuits such electromigration frequently is a problem, resulting in the growth of, e.g., dendritic copper in between conductor channels which should remain separated.

For that matter, the application of laminates according to the invention is not restricted to printed circuits: laminates fully covered with a metal layer can also be employed in Electromagnetic Interference (EMI) shielding.

The modifying action of the polyamine polymer in accordance with the invention is twofold: first of all, the polyamine polymer is crosslinked to a certain extent, so that a laminate of the type described above is manufactured. Secondly, after modification the polyamine polymer layer will contain a residual amount of the amino reactive functional groups. As a result, the number of complexing sites of the polyamine polymer can be set as desired by so selecting the modifying agent and modifying conditions that the amino groups will be converted into less active or, on the contrary, more active complexing groups.

Using the above-mentioned process it is possible to affect not only the complexing activity but also the complexing site: by doing away with the complexing capacity in some places and maintaining or even increasing it in others complex forming using noble metal can be carried out patternwise, after which metallization also will be patternwise.

Also, use can be made of the amino reactive functional groups remaining after the modification by applying a second layer of polyamine polymer. This enhances the complexing capacity per unit of area. It has been found that in low activity metallization baths this can lead to a further enhancement of the metal peel strength. The process may be repeated, with the substrate being contacted alternately with polyamine polymer and a modifying agent until an optimum noble metal content has been attained and—after metallization—an optimum peel strength The more polyamine polymer is applied in this manner, the higher also the number of functional groups will be. In other words, an increased number of possibilities for affecting the complexing activity is thus obtained.

The process according to the invention has some further advantages compared with the known process. For instance, in a substrate coated with a partially crosslinked layer the degree of moisture absorption occurring when using developing and metallization baths is lower than in a substrate according to U.S. Pat. No. 4,701,351. In addition, it is possible to ensure a homogeneous layer thickness by removing non-crosslinked parts by washing, a process leaving crosslinked polyamine polymer.

Such advantages become even more manifest when the coated modified substrate is subjected to a heat treatment. Thus, e.g., treatment of the modified layer at 120° C. for 1 hour will give a higher peel strength.

Generally, polyfunctional aldehydes, epoxides, isocyanates or thio isocyanates are suited to be used for modification. Examples of suitable polyisocyanates are lowmolecular weight polyisocyanates, such as toluene diisocyanate, methylene diphenyl diisocyanate, isophorone diisocyanate, cyclohexane-1,6-diisocyanate, or hexamethylene diisocyanate, but also isocyanate terminated prepolymers, such as a reaction product of polypropylene glycol (Mn=2000) and cyclohexane-1,6-diisocyanate. An example of a suitable thio isocyanate is p-phenylene di-thio isocyanate. Suitable polyepoxides include phenol based epoxides such as bisphenol-A bisepoxide, cycloaliphatic polyepoxides, or aliphatic epoxides such as the diglycidyl ether of oligopropylene glycol or the triglycidyl ether of glycerol.

Both aliphatic and aromatic polyaldehydes are suited to be used, e.g. glyoxal or terephthalic dialdehyde. Because of its rapid reaction preference is given to glutyraldehyde (1,5-pentane dial).

To affect the degree of complexing activity of the polyamine it may be contacted with yet other reagents after having been modified. Thus the complexing activity may be enhanced by converting primary amino groups into carboxyl substituted ones, e.g. in accordance with the reaction

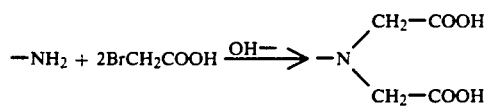

Alternatively, it is possible to decrease the complexing activity by converting part of the amino groups into noncomplexing groups, e.g. by reacting them with anhydrides, acid chlorides, or monofunctional isocyanates.

For appropriate metals and noble metals and metals reference is made to U.S. Pat. No. 4,701,351, which disclosure is incorporated herein in its entirety by reference.

The process according to the invention may also be employed in a so-called additive process, in which the noble metal is deposited patternwise onto the polyamine by means of the following technique: applying to the coated substrate a photoresist, exposing it in part to light, and developing it such that a polyamine pattern is exposed, whereupon the coated substrate is contacted with the noble metal ions.

Additive processes may be classified into three categories: fully additive, semi additive, and partially additive. The present invention can be applied to each of these processes. An elucidation of additive metallization is to be found in "Printed Circuits Handbook," 3rd edition, Chapter 13, Clyde F. Coombs, ed., MacGraw-Hill, New York, incorporated herein by reference in its entirety.

Additive processes generally involve the formation of plated-through holes (PTHs). PTHs are pillar-shaped connections between one patterned conductor layer and another. In conventional additive processes, where a substrate containing noble metal is provided with an adhesive also containing noble metal PTHs are associated with the problem of non uniform copper deposition, resulting in "corner-cracks", which occur at the interface of adhesive and substrate. According to the present invention a solution to this problem resides in that use is made of a board comprising a multilayered structure of substrate and adhesive both not containing noble metal, and that after drilling the appropriate holes and roughening the free surfaces, e.g., by chemical means such as a chromium/sulfuric acid bath, the board is provided with the polyamine polymer and subsequently subjected to the previously described modification step. Thus the board, at its surfaces and in the holes, contains a layer which is capable of complexing noble metal. Upon such complexing, the holes are favorably catalyzed for electroless plating. After a pattern has been formed in the modified polyamine polymer layer by means of a photo resist or a screen printing mask, the pattern and holes are complexed with noble metal and the board is metallized, resulting in conductive patterns and PTHs without the drawback of "corner-cracks".

The invention also relates to a process for metallizing a substrate comprising the initiation step described above, at any rate comprising noble metal ions being bound to the substrate in the above-described manner.

Such a process is carried out by placing the substrate to be metallized in an electroless metallization bath, such as the known baths for electroless copper plating or nickel plating. In a copper plating bath there may occur, e.g., the following reaction:

$$Cu^{++} + 4OH^- + 2CH_2O \rightarrow Cu^\circ + 2H_2O + 2HCOO^- + H_2$$

This reaction is catalyzed by noble metal (say, metallic palladium). The noble metal generally is added in the form of a salt. Prior to the substrate being placed in such a copper plating bath the noble metalions should be reduced to metallic noble metal. This process may be carried out using conventional reducing agents, such as $NaBH_4$. Alternatively, there are metallization baths which do not require prior reduction of the noble metal ions.

The invention will be illustrated below with reference to the following unlimitative examples.

EXAMPLE 1

A substrate in the form of a laminate that meets the National Electrical Manufactures Association FR-4 specifaction laminate (ex Romex) having a thickness of 1.6 mm had its surface area roughened by being treated with alumina particles of 60–90 μm in diameter under a pressure of 6 bar. The laminate was successively:
1. rinsed in absolute alcohol and dried to the air;
2. dipped in a polyethylene imine-containing bath consisting of 10 wt. % of POLYMIN P (ex BASF) in absolute alcohol. Polymin P is a 50 wt. % solution in water;
3. rinsed in demineralized water;
4. dipped in an aqueous solution of 5 wt. % of glutyraldehyde for 15 minutes at room temperature;
5. rinsed in demineralized water;
6. dipped in a 10 wt. % solution of POLYMIN P in absolute alcohol;
7. rinsed in water;
8. dried at 120° C. for 30 minutes;
9. dipped in demineralized water for 15 minutes;
10. dipped in a 0.1 wt. % solution of palladium chloride in demineralized water at pH 1.6 (set using concentrated HCl);
11. rinsed in water;
12. dipped in a 3 wt. % solution of $NaBH_4$ in water at pH 10.4, set using NaOH;
13. rinsed in water;
14. dipped in a copper plating bath (CUPOSIT 328 Q ex Shipley) for 30 minutes until a copper layer thickness of about 4 μm was obtained;
15. dried to the air and heated to 100° C. for 30 minutes;
16. dipped in 10 vol. % of aqueous sulfuric acid and copper plated further in a galvanic copper plating bath (CUPROSTAR LP-1 ex Blasberg) until the copper layer had a thickness of 35 μm.

In accordance with IPC-TM-650, No. 214181 peel strengths were measured on the homogeneously copper plated laminates. The peel strengths were in the range of 10 to 15 N/cm.

EXAMPLE 2

This Example illustrates the modification of the polyamine polymer by formaldehyde. Use is made of the following polyethylene imine/formaldehyde solution: To a solution of 150 g POLYMIN P (ex BASF) in 50 g demineralized water were added dropwise over a period of 90 minutes 50 g of a solution of formaldehyde in water, which was prepared by diluting 2 g of a 37 wt % solution of formaldehyde in demineralized water with 48 g of demineralized water. The resulting solution was diluted with absolute ethanol to a 5 wt % polyimine/formaldehyde solution.

A substrate in the form of a standard FR-4 laminate (ex Romex) having a thickness of 1.6 mm had its surface area roughened by being irradiated with alumina particles of 60–90 μm in diameter under a pressure of 6 bar. The laminate was successively:
1. rinsed in absolute alcohol and dried to the air;
2. dipped in said 5% polyethylene imine/formaldehyde solution for 15 minutes;
3. rinsed in water;
4. dried at 120° C. for 30 minutes;
5. dipped in demineralized water for 15 minutes;
6. dipped in a 0.1 wt. % solution of palladium chloride in demineralized water at pH 1.6 (set using concentrated HCl);
7. rinsed in water;
8. dipped in a 3 wt. % solution of $NaBH_4$ in water at pH 10.4, set using NaOH;
9. rinsed in water;
10. dipped in a copper plating bath (Cuposit 328 Q ex Shipley) for 30 minutes until a copper layer thickness of about 4 μm was obtained;
11. dried to the air and heated to 100° C. for 30 minutes;
12. dipped in 10 vol. % of aqueous sulfuric acid and copper plated further in a galvanic copper plating bath (CUPROSTAR LP-1 ex Blasberg) until the copper layer had a thickness of 35 μm.

In accordance with IPC-TM-650, No. 214181 peel strengths were measured on the homogeneously copper plated laminates. The peel strengths were in the range of 7 to 12 N/cm.

COMPARATIVE EXAMPLE

In conformity with the prior art, i.e. without further chemical modification, samples based on the same roughened FR-4 laminate were prepared for comparison by carrying out the same successive steps as described above, except that steps 4 through 7 were dispensed with. This resulted in samples having a peel strength in the range of 3 to 8 N/cm as measured in accordance with IPC.

EXAMPLE 3

A substrate in the form of a standard FR-4 laminate having a thickness of 1.6 mm was cleaned mechanically and treated with pumice. Obtained was an FR-4 laminate having a clearly less roughened surface area than the FR-4 laminates irradiated with alumina particles described in Example 1.

The samples were provided with copper by the same successive steps as described in Example 1 and the Comparative Example.

Samples prepared according to the present invention had a peel strength (in accordance with IPC) of 4–5 N/cm, whereas the samples prepared by prior art methods displayed uneven peeling behavior and had a peel strength of at most 1 N/cm. This can be explained by noting that the electroless copper plating process did not pass off evenly, which has to be attributed to local differences in the non-crosslinked polyethylene imine concentration on the FR-4 laminate caused by the partial dissolution of the non-crosslinked PEI.

EXAMPLE 4

A standard, commercially available FR-4 laminate laminated with copper foil on either side, of a thickness of about 1.6 mm, had all of its copper removed by etching, so that a substrate in the form of a bare FR-4 laminate was obtained with, as detected by Scanning Electron Microscope, a greatly roughened even surface area.

The laminate material was copper plated according to the invention as described in Example 1. Peel strengths were measured in accordance with IPC and found to be in the range of 12-14 N/cm, which virtually corresponded to the peel strengths (13-15 N/cm) determined on the purchased copper foil-laminated FR-4 laminate.

Plates of 25.4 mm × 25.4 mm were sawn from the copper plated samples and tested in a soldering bath in the following manner:

10" dipping into solder at 260° C.;
5" dipping into solder at 285° C.;
10" one-sided contacting with the solder surface area at 260° C.;
5" one-sided contacting with the solder surface area at 288° C.

All plates passed the soldering test without any blistering or delamination.

EXAMPLE 5

A substrate in the form of a standard FR-4 laminate measuring 10 cm × 16 cm and having a thickness of 1.6 mm was, as described in Example 1, roughened with alumina particles and treated according to the successive steps described in Example 1, except that steps 3 through 7 were altered as follows:

3. rinsed in absolute ethanol and subsequently in anhydrous acetone;
4. dipped for 15 minutes at 70° C. into a 5% solution of the reaction product of 1 mole of polypropylene glycol (having a number average molecular weight of 2000) and 2 moles of trans-cyclohexane diisocyanate in acetone. The reaction product had an isocyanate content of 0.842 meq per g of solids;
5. rinsed in anhydrous acetone;
6. dipped into a 10 wt. %-solution of Polymin P in absolute ethanol;
7. washed with absolute ethanol and subsequently with water.

The peel strength as measured in accordance with IPC was 10-14 N/cm.

I claim:

1. A process for the deposition of a noble metal onto an electrically non-conducting Polymeric substrate with the noble metal being bound tightly to the substrate, comprising
    a. coating the substrate with a layer of polyamine polymer modified by being contacted with a compound containing at least two functional groups reactive to amino groups, followed by
    b. contacting the coated substrate with noble metal ions.

2. The process of claim 1, wherein the substrate is coated with a second layer of polyamine polymer prior to the coated substrate being contacted with the noble metal ions.

3. The process of claim 1 wherein the coated substrate is subjected to a heat treatment prior to being contacted with the noble metal ions.

4. The process of claim 1 wherein the polyamine polymer used is polyethylene imine.

5. The process of claim 1, wherein the polyamine polymer is modified with 1,5-pentane dial.

6. The process of claim 1 wherein the noble metal is deposited patternwise onto the polyamine polymer by means of applying to the coated substrate a layer of photoresist, exposing it in part to light, and developing it such that a polyamine polymer pattern is exposed, whereupon the coated substrate is contacted with the noble metal ions.

7. The process of claim 1 wherein the substrate on which the noble metal is deposited is further contacted with a metallization bath to effect electroless metallization.

8. The process of claim 7 wherein the metallization bath used is a copper plating bath.

9. A process for the manufacture of a multilayer printed circuit board comprising conductive patterns and conductive plated-through holes comprising subjecting a board comprising a multilayer structure of Polymeric substrate and adhesive, but not containing seeds of noble metal, to the steps of
    a. forming holes in the board;
    b. roughening the board surface and holes;
    c. applying a layer of a polyamine polymer layer to the surface and holes;
    d. modifying the polyamine polymer by contacting it with a compound containing at least two functional groups reactive to amino groups;
    e. complexing the modified polymer layer with noble metal ions; and
    f. carrying through electroless metallization by contacting the board with a metallization bath.

* * * * *